(12) United States Patent  (10) Patent No.: US 7,903,255 B2
Kaplan  (45) Date of Patent: Mar. 8, 2011

(54) SAGNAC SENSOR WITH NESTED WAVEGUIDES

(75) Inventor: Arkady Kaplan, Rockville, MD (US)

(73) Assignee: CeLight, Inc., Silver Spring, MD (US)

( * ) Notice: Subject to any disclaimer, the term of this patent is extended or adjusted under 35 U.S.C. 154(b) by 315 days.

(21) Appl. No.: 12/192,593

(22) Filed: Aug. 15, 2008

(65) Prior Publication Data

US 2009/0046294 A1 Feb. 19, 2009

Related U.S. Application Data

(60) Provisional application No. 60/956,161, filed on Aug. 16, 2007.

(51) Int. Cl.
*G01C 19/72* (2006.01)
(52) U.S. Cl. ......................................................... 356/460
(58) Field of Classification Search .................. 356/459, 356/460, 465
See application file for complete search history.

(56) References Cited

U.S. PATENT DOCUMENTS

| 4,793,708 | A  | * | 12/1988 | Bednarz ......................... 356/465 |
| 4,952,059 | A  | * | 8/1990  | Desurvire et al. ............ 356/461 |
| 5,627,644 | A  | * | 5/1997  | Sanders ......................... 356/464 |
| 6,259,089 | B1 | * | 7/2001  | Vali et al. .................. 250/231.12 |
| 7,710,575 | B2 | * | 5/2010  | Schwartz et al. ............. 356/459 |
| 2005/0196103 | A1 | * | 9/2005  | Kaplan ........................... 385/50 |
| 2007/0291273 | A1 | * | 12/2007 | Yokouchi et al. ............. 356/459 |
| 2008/0291459 | A1 | * | 11/2008 | Meyer et al. ................. 356/462 |

* cited by examiner

*Primary Examiner* — Tarifur Chowdhury
*Assistant Examiner* — Jonathan M Hansen
(74) *Attorney, Agent, or Firm* — Nadya Reingand (57) ABSTRACT

Proposed optical device is based on counter-propagating optical fields within at least one nested waveguide-cavity loop, where the part of the waveguide loop is fold into the external waveguide loop. The nesting is performed using at least one waveguide crossing section. The invention may be used in Sagnac interferometer to measure various physical parameters, including rotation rate, electric current and mechanical perturbations. The invention also addressed a measurement method of such non-reciprocal parameters of interest. Optionally, the cavity includes a gain element, and the device operation may be switched discretely or gradually between passive and active regimes, thus changing the measurement characteristics.

24 Claims, 9 Drawing Sheets

SAGNAC SENSOR WITH NESTED WAVEGUIDES

CROSS-REFERENCE TO RELATED APPLICATIONS

This application claims priority of U.S. provisional application Ser. No. 60/956,161 filed Aug. 16, 2007.

FIELD OF INVENTION

This invention relates generally to light wave circuits and methods of their fabrication and use. In particular, this patent application addresses a novel structure of the integrated sensor based on optical fields that counter-propagate in nested waveguide cavity. An invention is sensitive to rotation, electrical current, and other nonreciprocal perturbations of interest. Such sensors can be used in airplanes, submarines, unmanned aerial vehicle (UAV) and in variety of other civil and military applications.

BACKGROUND OF THE INVENTION

Sagnac interferometers are used mostly in optical devices for rotation sensing of electrical current sensing. Typically, two optical beams travel in the opposite direction in a closed loop (CW and CCW respectively), and the system is symmetrical in absence of the rotation. If the lights of both beams is mixed and impinge a photo-detector, the photo-detector output is constant, and its value can be set by adding a phase shift in the loop. To match the laser source frequency and the resonant frequency, cavity phase shifters can be used.

Much effort has been expended in research and development into means of reducing both their initial cost and life-cycle costs of Sagnac sensors. In recent years, new technologies have enabled other kinds of sensors that are challenging the dominance of conventional Ring Laser Gyroscopes (RLG) (U.S. Pat. No. 5,371,589 by G. Martin) and Interferometric Fiber Optic Gyroscopes (IFOG) (U.S. Pat. No. 6,801,319 by B. Szafraniec) or electrical current sensors (U.S. Pat. No. 6,831,749 by A. Ohno et al.).

In conventional bulk RLG the counter-propagating waves are traveling in a quadrangular or triangular cavity with the mirrors at the extreme corners that redirecting the beams. The frequency difference between two counter-propagating waves is directly proportional to the applied angular velocity due to the Sagnac effect. It is expressed in terms of interference fringes that depend on the difference of the optical resonant frequencies of two beams. The output of an RLG is the beat frequency of the laser lines circulating in opposite directions, requiring relatively simpler electronic signal processing. The frequency output provides a wide dynamic range in the rotation sensing.

The basic IFOG based on Sagnac interferometer where two lights waves traveling in opposite directions in the coil experience different length, which results un different travel times and a phase differences in the two optical waves. The conventional fiber-coil based IFOG measures the photo-detector signal contains a Fourier line spectra of the modulation frequency that sin- or cos- rotation dependent. The spectrum lines are discriminated by lock-in amplifiers. The closed loop IFOG has an optical feedback element providing a feedback phase shift between CW and CCW optical waves proportional to the electrical output signal. The IFOG has the relatively complicated optical and electronic signal processing needed for retrieval of the Sagnac phase shift from the intensity output.

However, IFOG and RLG are very complex systems that require special fibers, separate modulators, optical modal filters, polarization controllers, etc. The need to overcome ambient-fluctuations and unwanted nonreciprocal phase shifts due to due to backscattering, Faraday effect and non-linear Kerr effect makes such devices very expensive and bulky.

New technologies are driving the need for batch-producible sensors potentially offering a performance improvement, while geared toward low life-cycle cost, small size, low production cost, and large-volume manufacturing (space applications). The recent trend of scientific research toward microsystems for space applications includes the study, design and fabrication of integrated ring resonator Sagnac sensors, based on semiconductor technology (U.S. Pat. No. 5,325,174 by J. Danko, U.S. Pat. No. 5,872,877 by J. Haavisto, U.S. Pat. No. 6,259,089 by V. Vali et al.). Future improvements are expected in sensitivity and reduction of the size and weight of the sensor. Such miniaturizing a sensing device leads to low weight, compactness, low power consumption while allowing an easy access to greater redundancy and integration that is especially important under hostile environment conditions.

Integrated ring-resonator sensors on Sagnac interferometer (both integrated and not-integrated) can be used, for example, for rotation and magnetic field measurements. Ring resonator cavity (RRG) gyroscopes can be used, for example in spacecraft and satellite applications. Being compact, fully autonomous, highly accurate and uninfluenced by weather conditions they can be almost ideal navigation devices.

The critical gaps, separating the RRC from the tangential waveguides of the sensor, determine the input and output coupling ratios of the cavity, which, in turn, define the magnitude of the finesse, the at-resonance transmittance and, finally, the sensitivity of the device.

In existing integrated ring sensors, while providing the high-density integration potential and small dimensions, make efficient adjustments of cavity parameters a challenging task, limiting their direct implication within various optical systems.

The major disadvantage of the existing ring-resonator sensors based on the following limitations:

The size of the integrated resonator cavity is limited by the size of the substrate (wafer) or minimum bending radius of the waveguide (U.S. Pat. No. 5,872,877 by J. Haavisto, U.S. Pat. No. 6,259,089 by V. Vali et al.). In this case the optimal cavity length to provide a desired accuracy can not be achieved.

Because of the high optical confinement and short coupling distances in RRC, the coupling coefficients are not readily tuned once the sensor is fabricated, especially in an independent fashion. For example, it is difficult to ensure that the two coupling gaps/lengths on two sides of the resonator cavity are matched. The finesse and the extinction ratio of the cavity would be impaired if the coupling factors and cavity phase are not matched to required conditions.

The corresponded layouts for the counter propagated waveguides (CW and CCW) are asymmetrical (U.S. Pat. No. 6,259,089 by V. Vali et al.), making device more sensitive to unwanted nonreciprocal perturbations, including ones caused by possible waveguide optical amplification (loss-compensation).

The RRC with independently tunable add/drop coupling and phase control were reported previously (U.S. Pat. No. 7,123,800 by A. Kaplan) for general purpose.

The spiral waveguide geometry were reported in previous art without connection to sensing cavities (U.S. Pat. No.

Figure 1:
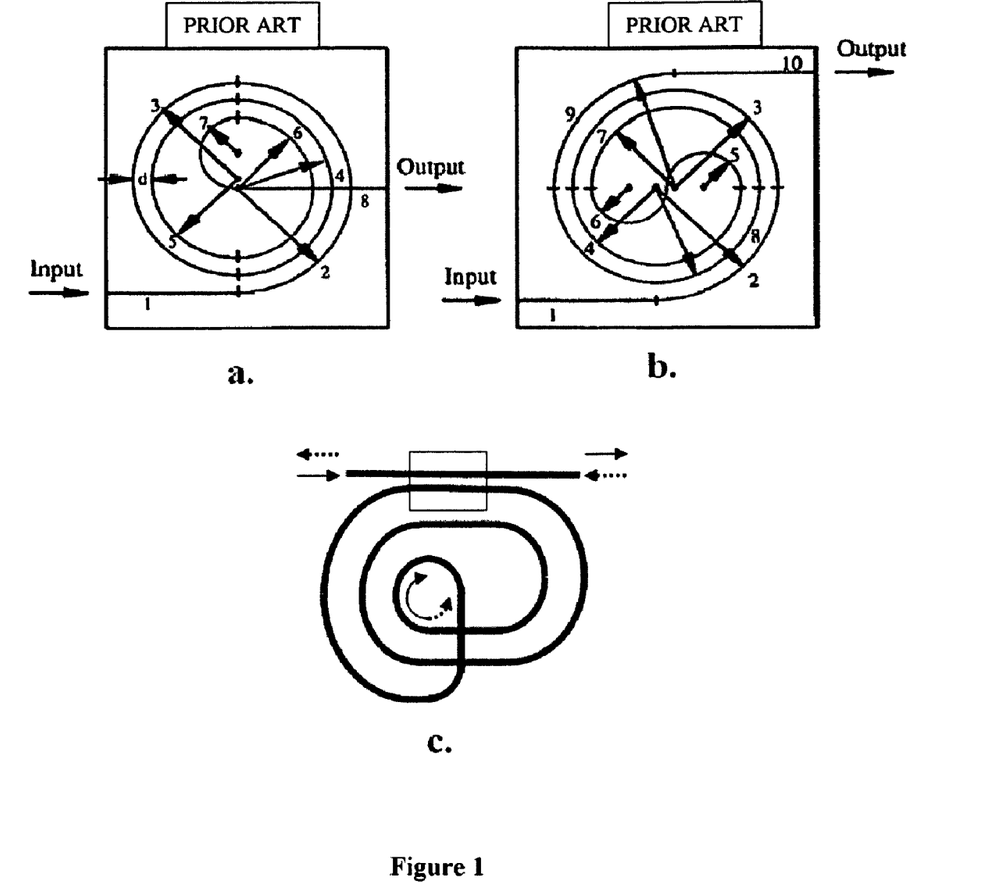

7,133,584 by J. Doan, U.S. Pat. No. 6,922,510 by T. Hatanaka, U.S. Pat. No. 5,953,468 by C. Finnila), or for non-integrated fiber coils (U.S. Pat. No. 6,885,456 by Y. Hashimoto). FIG. 1(a),(b) shows examples of the previous art spiral geometry that includes bends of different radii and right-angle intersections to achieve a long path (cavity) in a compact chip. The consecutive sections of different curvature are shown. The type (b) in FIG. 1 is widely used for the silicon-based lightwave integrated planar circuits. Unfortunately, such fold-back bend cavity can not be used in Sagnac interferometer due to a self-compensated Sagnac effect.

For the Erbium doped folded layouts the modeling of amplification is non trivial since the different radiation losses and distortion of the transverse fields of both the pump and the signal have to be taken into account. It was shown that layouts can be ranked in accordance to their ability to provide maximum gain within a given chip area and an optimum layout based on a spiral containing both straight and curved waveguide sections is identified as an optimal. The potential presence of Erbium in the active region ensures a strong anisotropic optical gain, which is polarization dependent. By emitting TE modes only, active cavity can be polarization selective and, therefore, neither effects of birefringence and coupling between the two polarizations, nor additional polarization noise can be observed.

The two major constraints in design of compact spiral erbium-doped waveguide amplifiers (EDWAs) can be considered: a) minimization of the chip area required for obtaining a predetermined gain, and b) maximization of the gain available from a limited area. The optimum layout usually identified by its ability to provide a maximum gain within a given chip area. The best layout appears to be a rectangular-footprint spiral containing both straight and curved waveguide sections, in which the radii of curvature are equalized everywhere, as far as possible, see FIG. 1,(c). While these two constrains are still valid for the Sagnac sensor applications, there is an additional constrain has to be considered that related to reciprocity of the structure with counter-propagating fields. Thus, a geometrically symmetrical layout of Sagnac sensor is desirable to better compensate for various reciprocal noise-factors in counter-propagating fields.

To summarize, there is a need for reliable RRC-sensor with improved sensitivity and accuracy as well as reduced dimensions and weight.

It is desirable to have a sensor with RRC that has an optimal perimeter-to-area (L/A) ratio (losses versus Sagnac effect). By this means, the highest sensitivity for the given cavity losses can be achieved.

At the same time, it is desirable to have a cavity that takes a minimum space on the wafer, to provide a high fabrication yield and low fabrication cost.

Furthermore, it is also desirable to have a cavity that is geometrically symmetrical, in order to provide an identical optical path for the two counter-propagating optical fields.

Furthermore, it is also desirable that the RRC cavity quality factor can be effectively adjusted accordingly to desirable cavity response, thus, for example, enabling the compensation of cavity couplings mismatch caused by fabrication errors.

Furthermore, it is also desirable that the cavity will include the controllable loss-compensation mechanism, such as in-waveguide amplification.

Electro-optical sensor that possess all mentioned qualities can, potentially, incorporate the advantages offered by Fiber Optic Sagnac Sensors while achieving the high cavity finesse and sensitivity of a Ring-Laser Sagnac Sensors at the cost comparable with some Micro-Electro-Mechanical System (MEMS) sensors.

SUMMARY OF THE INVENTION

A single mode waveguides can be used to make an optical cavity by forming a closed loop configuration to constitute a low loss cavity. The invention consists of an optical device having at least one nested-waveguide-based cavity (called for simplicity the "ring"), where the part of the waveguide forms a loop inside (i.e. folded into) the external waveguide loop of the cavity. The nesting is performed using at least one waveguide crossing section with waveguides crossing each other without interaction of the optical beams transmitted along these waveguides. In general case, the cavity may have multiple crossing sections and multiple nested loops, one inside another. In another embodiment multiple nested cavities may be joined to form a closed loop cavity of the present invention.

The cavity has at least one axis of symmetry. A novel, nested guiding cavity arrangement is preferable due to its inherent layout symmetry towards clock-wise (CW) and counter-clockwise (CCW) propagating fields. This is important since the reciprocity is vital to Sagnac sensor performance. A detector registers a difference between the extracted CW and CCW waves characteristics such as, for example, phase or polarization. The detector is followed by a signal processing unit calculating the physical parameter of interest basing on the registered difference.

In the preferred embodiment a single coupler is used both for introducing and extraction of the CW and CCW optical waves to- and from the cavity, respectively. However, separate couplers may be used as well. In one embodiment the coupling ratio of the coupler(s) is tunable.

Optionally, the cavity may include at least one phase shifter in the cavity for changing the phases of the CW and CCW waves.

The device can be fiber-based or integrated into a substrate (such as, for example, semiconductor or ferroelectric or glass or polymer wafer).

In one embodiment, a sensor has a laser, followed by MZI-switch in combination with the electro-optic PSK modulator and electrical signal processing control loop.

While having all the benefits of modern planar waveguides technology, proposed integrated cavity enables an independent adjustment of the add/drop coupling and phase, resulting in improved applicability over conventional ring structures with inseparable controls of cavity parameters. Adjustments can be realized by means of electro-optical effect, thermo-optical effect, mechanically, or by combination of above, as an example.

The present invention disclosed a method of a physical parameter measurement, which includes passing a clockwise (CW) and a counter clockwise (CCW) propagating optical waves through an optical cavity being a closed waveguide loop having at least one nested configuration with at least one axis of symmetry, the cavity having at least one waveguides crossing section within the cavity; extracting the CW and CCW waves from the cavity; detecting a difference between the characteristics of the extracted CW and CCW waves; and calculating the physical parameter of interest basing on the detected difference. Optionally, the method includes phase modulating of the extracted CW and CCW waves for eliminating of a backscattering signal from the detector. In one embodiment the method comprises amplifying the CW and CCW waves using an optical gain element.

The gain element operation in the optical device of the present invention may be controlled by changing either the power of a pumping laser directly, or by external pump modulator, or by adjusting a coupling ratio of a pump coupler that couples pumping light into the cavity. Controlling of the optical flow within the cavity by tuning the gain element, coupling ratios and the cavity phase enables an effective change of the measurements scale and, as a result, allowing various operation regimes for the proposed device. In preferable configuration, the real time control of the mentioned parameters can be realized either in separate or simultaneous fashion.

The present invention also discloses a novel optical device for a physical parameter measurement with variable sensitivity. This device includes an active optical cavity with an optical gain element by means, for example, of an Erbium-doped (Er+) waveguide core in the preferred configuration. The optical gain element compensates losses in the CW and CCW waves within the cavity. The gain magnitude may be externally changed gradually or discretely, changing the magnitude of the optical field in cavity and, thus, modifying device sensitivity and other measurement parameters in a real time. Both, the passive and active proposed cavities, can be designed with the potential to be fully integrated into a single chip, with optical source and red-out electronics potentially included into a single package. Different variations are possible, depending on amount of nested elements, mutual location of the cavity and the optical mixing/detection part, also depending on available wafer area and device application.

The optical device of the present invention may be used to measure various physical parameters, including a rotation rate, a magnetic field, an electrical current and mechanical perturbations.

Advantages of the preferable configuration are integration of different electro-optical functions on a single chip of very small dimensions, reduction in size and mass, absence of any matching technique between optical modes, optical beam frequencies and the cavity resonant frequencies, high polarization selectivity, managed curvature losses, high quality factor, and, as a result, potentially greater sensitivity and low quantum limit.

DESCRIPTION OF THE DRAWINGS

FIG. 1. Planar layouts: (a) —spiral, (b) —folded spiral not suitable for Sagnac sensor. The ring cavity based on the EDWA design is shown in (c).

FIG. 2. (a), (b), (c) Novel symmetric expandable waveguide cavity layout for Sagnac interferometer with 1, 2 and 3 nested loops, respectively; (d) Rectangular-shaped nested layout; (e) Waveguide cavity with two nested layouts.

FIG. 9. Example of the resonator cavity response for 2 regimes of operation: (a) —loss compensated cavity, (b) —cavity without loss-compensation.

DETAILED DESCRIPTION OF THE PREFERRED EMBODIMENT

The new type of the integrated device is proposed that benefits from the cavity tunability (such as electro-optical or thermo-optical control) and optional loss-compensation capability (such as Erbium doping). In addition, the length of the cavity can be adjusted providing the optimal sensor performance without significant increase in cavity area. Furthermore, the proposed sensing element has an improved compensation for various reciprocal noises, such as amplification noise, birefringence and other reciprocal performance impairments.

The invention device can serve, for example, as the rotation sensor (gyroscope) or electrical current/magnetic field sensor or mechanical perturbation sensor. The counter-propagating light waves passing through the sensing medium experience a differential phase shift caused by a magnetic field or current flowing in a conductor proximate to the cavity. Detectors are coupled to the waveguides, detecting corresponding phase shift and producing an output signal.

Proposed miniaturized cavity-integrated sensor configuration has potentially significant advantages with respect to the existing sensors, in terms of accuracy, reliability, reduced dimensions and weight. Such device can be realized with passive or active resonant cavity. Advantages of the invention are the high sensitivity, possibility of relatively low-cost batch-fabrication, mechanical stability (no moving parts), low power consumption, high polarization selection and high reliability.

The cavity with identical (geometrically symmetrical) clockwise (CW) and counterclockwise (CCW) propagating paths is desired to provide a better reciprocal compensation for losses, amplification noise, birefringence and other reciprocal sensor performance impairments. In this connection, the invention includes the "nested" cavity layout with the expandable amount of folds and waveguide cross-sections, as shown in FIG. 2.

Figure 2:
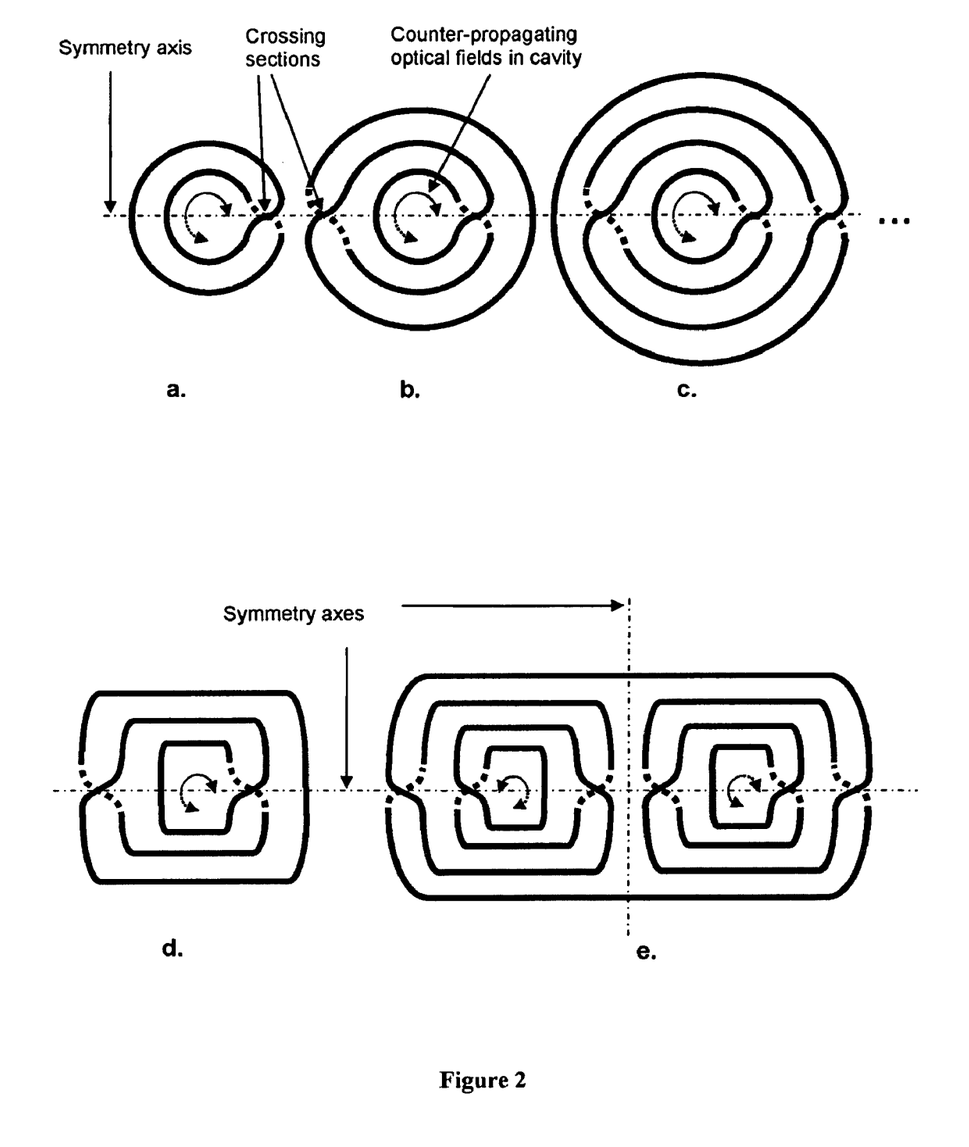

FIG. 2 (a), (b), (c) show the 2-loop, 3-loop and 4-loop nested waveguide layouts for the cavity, respectively. All such nested layouts are identical (symmetrical) for counter-propagating fields CW add CCW. Eventually, the nested cavity with N loops and (N-1) cross-sections can be build by a similar way (N- is an integer number).

The shape of the cavity (and nested loops) is not limited to circle configuration. Thus, FIG. 2(d) illustrates the rectangular-shaped cavity, which is similar to the round cavity in FIG. 2(b). Also, the cavity can include more than one nested layout. Thus, an example, FIG. 3(e) illustrates the two nested layouts included into a single cavity. Such configuration can possess an additional line of symmetry that can be used as an additional degree of freedom in Sagnac sensor reciprocal design. All described cavities can be used as a sensing element of the Sagnac sensor, as shown below.

The importance of this invention is that it enables a compact/larger-scale integration of the Sagnac interferometer components on a single substrate by compensating for passive losses while providing a substantially larger sensing area that is proportional to the Sagnac effect.

Furthermore, invention can provide the cavities with the large circumference needed for the optimum sensitivity of the interferometer, and it could be realized within available wafer space by using various proposed geometrical solutions for the cavity.

The invention can further benefit from existing complex integrated electro-optical or thermo-optical technology, such as semiconductor epitaxial growth or ferroelectric technology (e.g. LiNbO$_3$ crystal), including Erbium doping and etching. Thus, the high-sensitive planar integrated micro-optic sensors with a new type of cavity can be realized by wafer batch-processing and with fewer mechanical manual interconnections. For example it can become an attractive choice for the relatively low-cost/high-volume, extra-high sensitivity gyro-sensor market.

Figure 3:
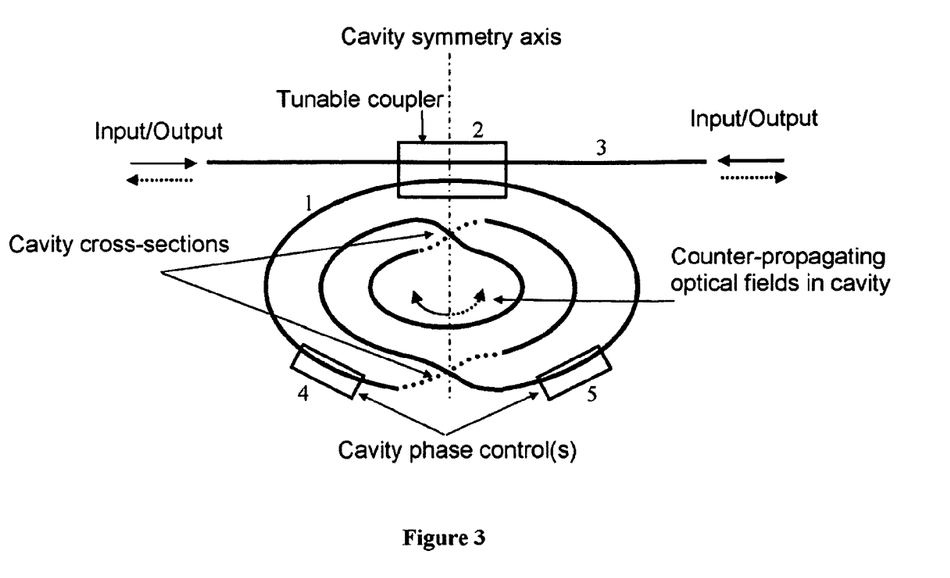
FIG. 3. Novel symmetric expandable waveguide nested layout for tunable Sagnac sensor.

FIG. 3. illustrates the concept of the resonator device based on the novel cavity layout. The cavity layout of, generally, non circular shape 1 is coupled by a coupler 2 to at least one input/output waveguide 3. The layout has a line of symmetry and may include one or more phase controllers (4 and 5 in FIG. 3). In the preferred embodiment the coupler 2 has an adjustable add/drop coupling ratio, as shown in FIG. 3. In another embodiment the cavity is coupled to the input/output waveguides via two or more couplers.

Possessing the two optical beams traveling in opposite directions (CW and CCW) in the cavity closed loop, such device can be used as a sensor of various induces nonreciprocal perturbations, such as, for example, in-plane rotation of the cavity, presence of the magnetic field within the cavity, electrical current within the cavity and others.

Figure 4:
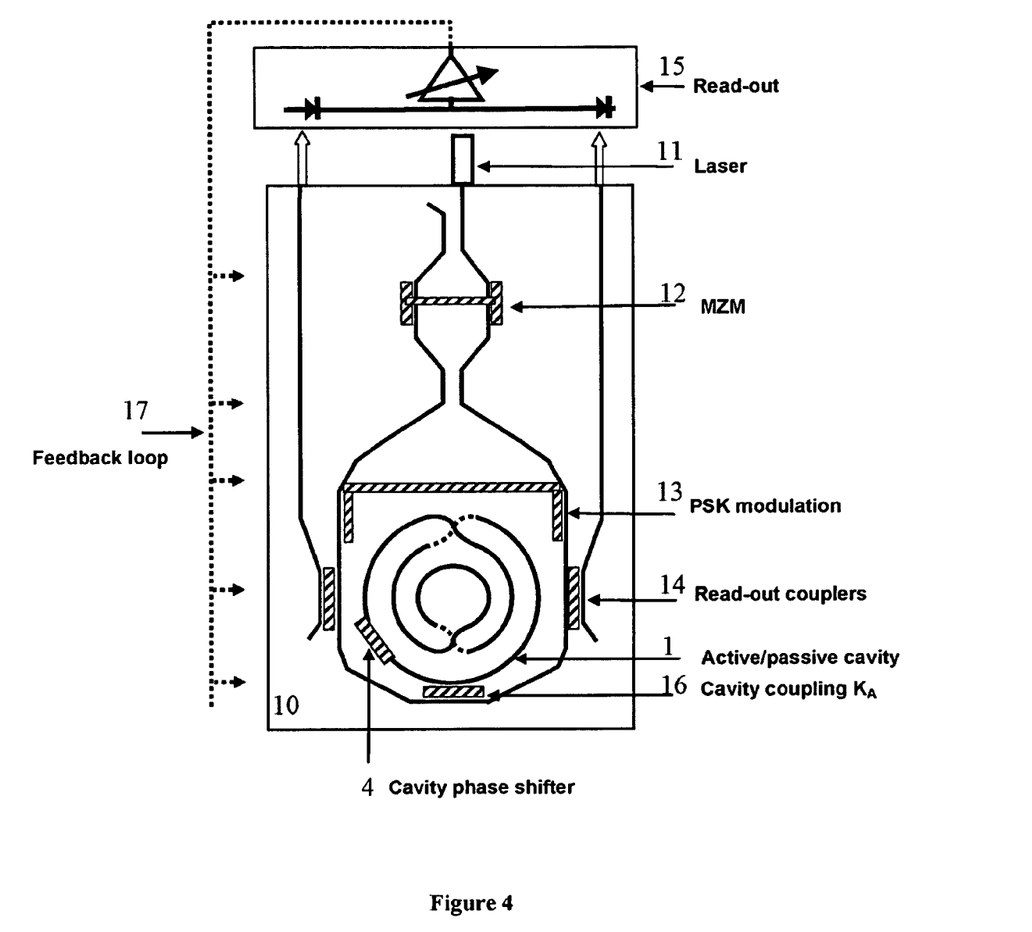
FIG. 4. Preferable configuration of the integrated sensor chip to use, for example, in angular rate measurements (Gyroscope).

FIG. 4 shows a preferred configuration of the new Sagnac optical sensor that is monolithically integrated on a planar lightwave circuit 10. It comprises of the following main elements: a novel nested cavity 1, optical laser source 11, Mach-Zehnder switch/modulator (MZI) 12, a phase modulator 13 and readout electro-optical block 15, which include two photodiodes and measurement electronics. The cavity is a sensing element and can be build accordingly to the desired number of folds (crossing sections), as shown in FIG. 2. The number of folds in the cavity is defined by device application and specifications.

In preferable configuration, using of semiconductor laser rather than expensive broad-band light source such as superluminescent laser diode (SLD) is proposed.

In a preferred embodiment a laser source 11 is followed up by an interferometric modulator MZI 12, which induces a modulation of the carrier, then followed up by a phase modulator 13, which put the backscattered lightwave and the counter propagating signal out of the sensor bandwidth, as described below.

The output from a laser 11 is passing through an MZI 12 and frequency shifted by phase modulator 13 before being coupled into the resonator cavity 1 in opposite directions that creates an added bias in-between CW and CCW waves. When the cavity is not perturbed, the CW and CCW beams are locked to the resonant CW and CCW frequencies, the photodetector block 15 measures a constant output, calculated from two fields coupled out by couplers 14. The value of this constant output can be set by an appropriate calibration of the modulator/cavity phase. If L is the optical cavity length, the resonance condition is given as $\beta L = 2 m\pi$, ($\beta$ is the waveguide propagation constants, m-integer), which is the equivalent to the integer number of wavelength in the cavity. To match the laser source frequency and the resonant frequency, cavity phase shifter(s) 4, see FIGS. 3, 4, or tunable laser 11 can be used.

Rotation measurement example. When a rotation around an axis normal to the device plane occurs, the two beams in the cavity traverse different optical paths and resonant conditions changes differently for each beam. This is generates the frequency difference between counter-propagating beams that is ideally is proportional to the rotation rate of the cavity 1. The beams are coupled out through tunable couplers 14 and mixed in the photodetectors 15 where a small frequency difference modulates the detector current. The couplers 14 can be tunable, i.e. have adjustable coupling ratios. The detectors in 15 cane be reverse-biased (balanced) diodes with high optical absorption to minimize the light reflected at the waveguide termination.

Electrical current measurement example. The Sagnac interferometer can be used as an interferometric electrical current sensor. In this configuration, two waves counter-propagate in the cavity 1 interfere after recombination on the photo-detector block 15 via couplers 14. The electrical current induces a non-reciprocal phase shift that is reflected in the interference pattern and can be measured.

For all types of measurement, the interference noise can be decreased when the carrier component of the CW or the CCW wave is eliminated by a sinusoidal FM or PM modulation by 13, since the interference component goes out of the signal band. To achieve a wide dynamic range the closed loop operation must be adopted. It can be realized using a feedback control loop 17, as shown in FIG. 4. For all types of measurement the Rayleigh backscattering can be reduced by PSK (binary phase shift keying) modulating of a backscattering wave, alternating its phase between 0 and $\pi$, and, thus, inherently eliminating the carrier component from the signal.

The invention can use a polarization maintaining waveguides (fiber) and polarization controller(s) to reduce the effects of the polarization fluctuation in cavity.

Furthermore, the invention can involve LiNbO$_3$ annealed photonic exchange (APE) waveguides as countermeasures for polarization related noise factors.

Control loops 17, see FIG. 4, continually, adjust the frequencies to maximize the power output on the detectors 15. Control loops 17 can include modulation of the optical source 11, control of MZI 12, control of modulator 13, tuning of couplers 14 and 16, and cavity phase control 4. Adjustment can be realized by various means, such as, for example, electro-optical or thermo-optical effects.

If the cavity is perturbed, the resonant frequency in one direction increases while that in the other direction decreases. The control loops 17 respond by adjusting the appropriate frequencies to maintain a set frequency difference between the two beams. The magnitude of the perturbation is proportional to the absolute difference in the beat frequencies. In case of rotational measurement, the direction of rotation depends on the relative difference off-center. The control loops 17 will perform differently in case of the loss compensated cavity, which will be described below.

The MZM 12 in combination with cavity phase tuning 4 (see FIG. 4) can perform an additional function of the device calibration when no perturbation occurs, i.e., to change the phase by the appropriate dc bias in order to have exactly zero output at the detector. The induced phase shift must compensate in this case for the possible difference of optical paths due to either the fabrication tolerances or defects.

The coupling control 16 is used to optimize the device performance by adjusting the coupling ratio to the cavity propagation losses.

Figure 5:
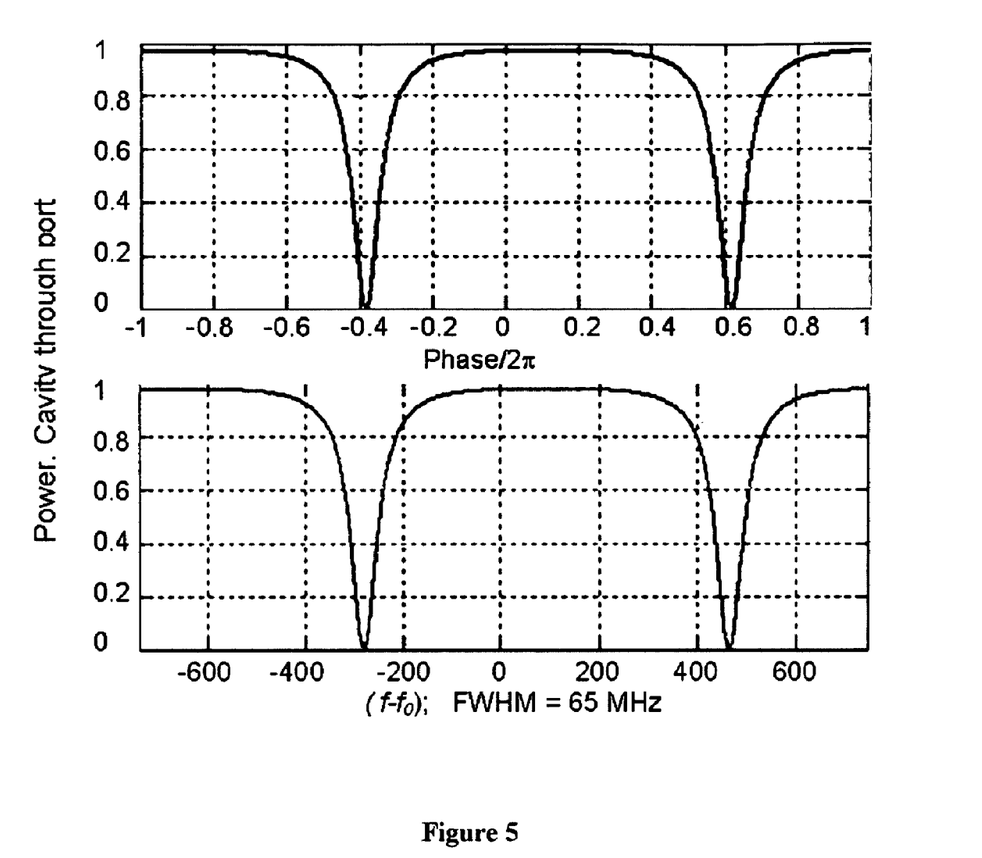
FIG. 5. Typical example of resonator cavity response.

Typical passive (without loss-compensation) cavity resonator performance is shown in FIG. 5, as an example for the cavity length (circumference) L=28 cm, wavelength $\lambda$=1.55 $\mu$m, and normalized coupling value for the $K_A$ coupler 16 (FIG. 4): $2K_A/\pi = 2\kappa Lc/\pi = 0.32$, where Lc is the effective coupling length of the coupler.

Figure 6:
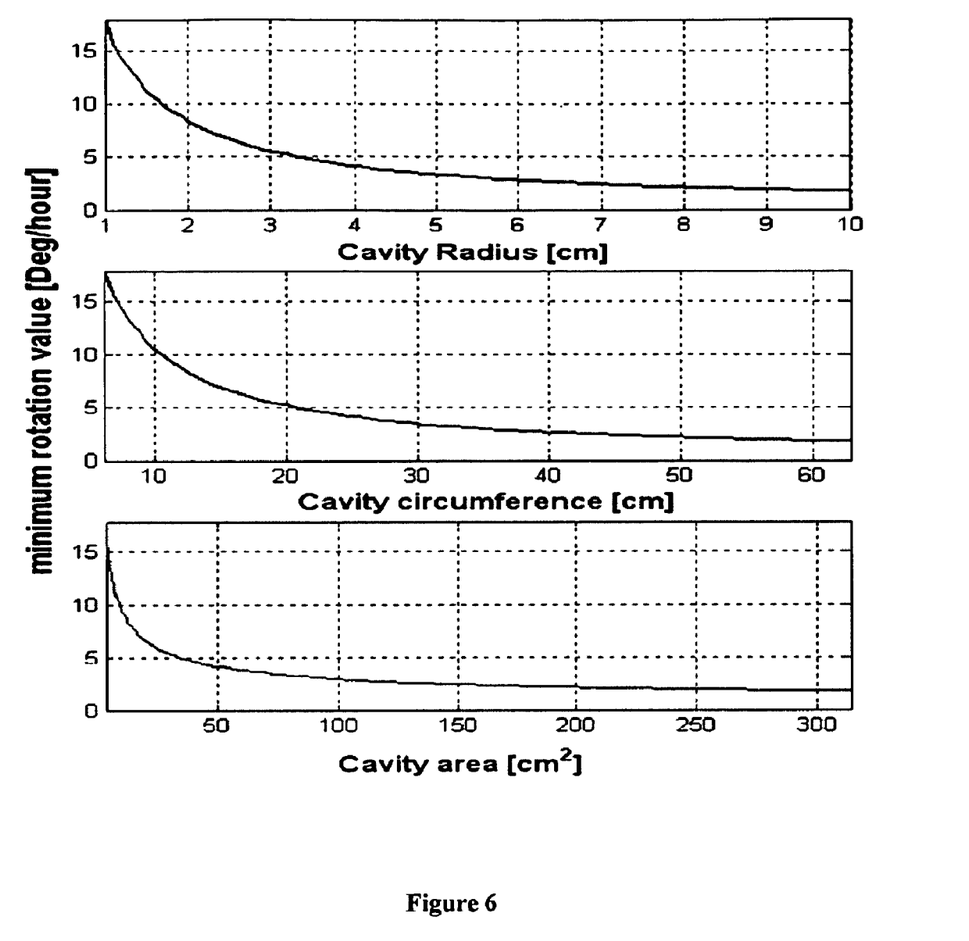
FIG. 6. Passive cavity sensitivity limit as a function of cavity size.

In case of the rotation measurement (i.e. sensor as a gyroscope), the minimum rotation rate can be optimized in terms of the cavity size for the passive cavity. FIG. 6 shows the minimum measurable rotation rate as a function of the cavity size, using rest of parameters from FIG. 5. It can be seen that increasing the cavity circumference beyond ~25 cm will not significantly affect the minimum sensitivity value.

To summarize, the advantages of the proposed cavity, without loss compensation, are as follows: reasonable sensitivity, absence of gain variations of the laser, relatively low fabrication cost, shock and vibration immunity due to the absence of moving parts, low power consumption for the small number of the components, high polarization selection in guided-wave structures (that avoids polarization fluctuation induced noise and Kerr effect that are present in IFOG devices) and high reliability. Moreover, the described passive cavities do not have problems such us lock-in effect and mode competition.

However, the disadvantages of the passive cavities are following: the need of low-loss waveguides and relatively large waveguide losses, bending-losses and roughness-related limiting the finesse of the cavity. In order to get a finesse of 200-300 without loss compensation, the cavity and couplers each need to have loss less than ~1%, for a few cm diameter cavity and source wavelength of 1.55 µm.

Recently, the case of fabrication of low-loss Erbium doped ($Er^+$) waveguides has allowed the development of a whole new family of advanced laser devices of higher functionality that also benefit from electrooptical, acoustooptical, and nonlinear optical properties of the various substrates. $Er^+$ indiffusion has been demonstrated to be a simple but powerful technique to fabricate waveguide amplifiers.

In this connection, the invention further includes the integrated cavity (sensing element) with built-in lasing, properties to compensate for the cavity propagation losses. Such slightly pumped (loss-compensated below threshold) cavities are included into the invention to be used, for example, in a high-sensitivity operation mode, as described below.

Any of the cavity configurations shown in FIG. 2 may be used for the active (with amplification) Sagnac sensor. As an example, the cavity from the FIG. 2(e) is chosen for the device shown in FIG. 7. As it was mentioned, the waveguides in the cavity 1 have to perform in a symmetric fashion with respect to the coupler 16. It is especially important if pumped Er+ waveguides are used since a symmetric layout provides a better reciprocity and, as a result, better immunity to impairments that caused by amplification noise.

Figure 7:
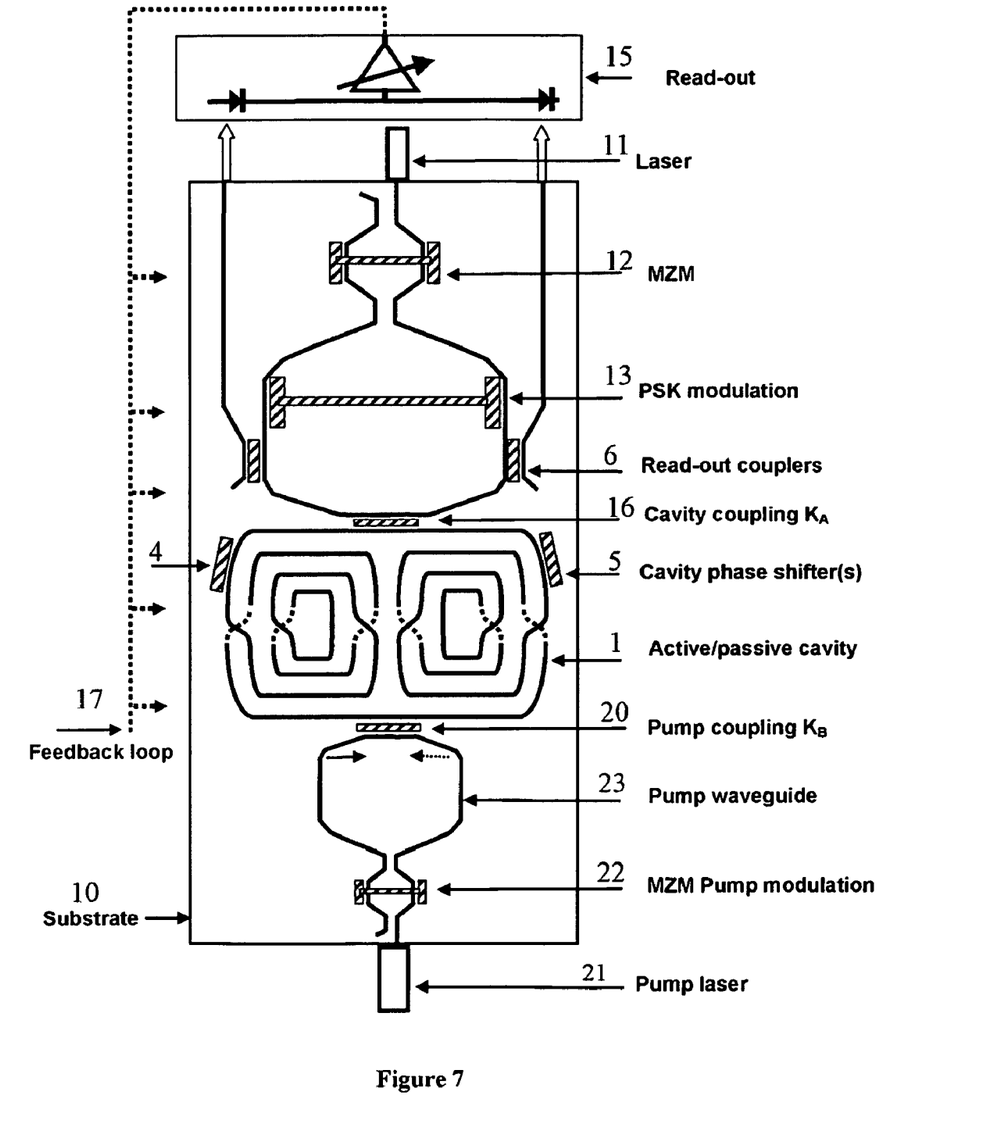
FIG. 7. Loss-compensated integrated resonator Sagnac sensor. Two different regimes of operation, with and without pump, are possible.

The possible realization of the proposed nested sensing cavity with amplification is shown in FIG. 7. In this configuration, the cavity 1 is modified (e.g. Erbium-doped) to provide an optical gain within. The additional pump coupler 20 ($K_B$) serves to introduce a diode pump wave (for example, with wavelength of 1.48 µm) in both CW and CCW directions using a pump transmitting waveguide 23. A pump modulator 22 can be used to modulate the pump wave coming from the pump laser 21. In such mode, the coupler 16 ($K_A$) serves as laser output coupler to observe the CW and CCW laser emission (and the guided spontaneous fluorescence) if threshold is surpassed.

An accurate efficiency optimization of the (tunable) couplers 16 ad 20 ($K_A$ and $K_B$, respectively) is required for a high (pump wavelength) and low (source wavelength) efficiencies. Possible different polarizations of these two wavelengths (pump and source) should be also taken into account. Various solutions are possible, such as waveguide tapering, polarizer integration, or intra-cavity wavelength selection by loss management due to metal coating or grating incorporation.

Invention enables an efficient adjustments of intrinsic ring resonator gain or loss (i.e. rate of energy flow), thus modifying the resonator response shape. The resonator response can be adjusted by the pumping control (through elements of 20, 21, 22), or by the couplings adjustment (through elements 16, 20), or by combination of these adjustments, see FIG. 7.

In such active (loss-compensated) cavities, if the total losses in the Sagnac sensor are fully compensated by gain the traveling-wave operation is realized at the resonant condition, which means that under the steady-state regime, the transfer function of the cavity is equal to 'one'. The losses due to the propagation in the external waveguides and to the components in each external branch can be compensated by appropriately choosing the value of the output power of the laser 11. The loss at the directional couplers affects only the transient regime, which has been evaluated of the order of µs, while, under steady-state conditions, it only modifies the resonant linewidth.

When using an active ring cavity with internal loss-compensation, the frequency difference (not the optical path difference) between the counter-propagating beams is measured, providing a larger scale factor of the sensor. This frequency difference is generally measured by heterodyning the two output beams. This increased scale factor together with the relatively simple small frequency difference measurements makes the active-cavity-based device extremely sensitive.

Best performance for such devices can be achieved when reciprocity in the structure is guaranteed. To reduce the measurement uncertainty resonant mode linewidth needs to be decreased, that is it needs to increase cavity finesse (reduce losses) at a fixed resonant frequency. When the losses in the cavity are fully compensated, the quality factor and, then, uncertainty will be affected only by the tunable coefficient of the cavity coupler 16, see FIGS. 4, 7. The SNR can be evaluated by calculating the photocurrent and the noise contribution at the detectors 15 and it also depends on couplings. To achieve very high sensitivity the coupling of 16 is expected to be very low.

The sensitivity value depends on the cavity perimeter-to-area (L/A) ratio (losses versus Sagnac effect) and larger cavity size can be considered for the optimal sensitivity. However, in case of fully compensated cavity-loss (FIG. 7, Erbium-doped cavity, laser-active waveguides), the trade-off between perimeter/area can be avoided and different cavity geometries can be considered (also with lower L/A ratio).

Figure 8:
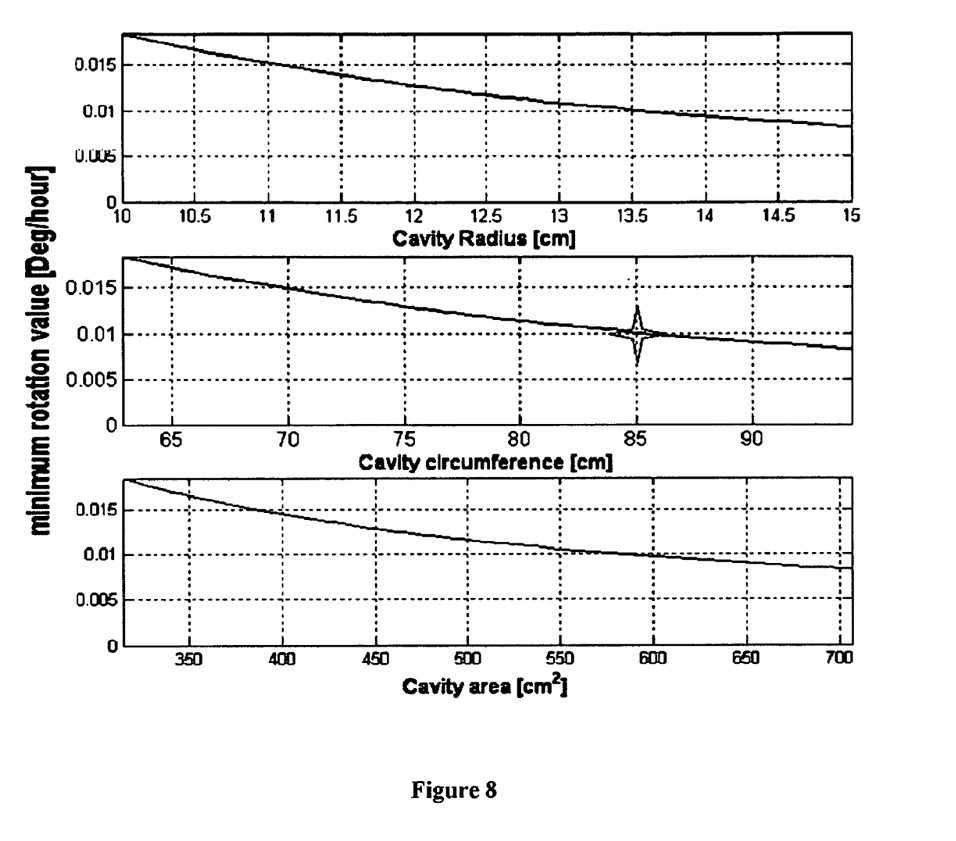
FIG. 8. Active cavity sensitivity limit as a function of cavity size.

Considering the gyroscope implementation of a Sagnac sensor, similarly to the passive case shown in FIG. 6, the FIG. 8 shows the minimum rotation rate value as a function of the loss-compensated cavity size. Thus, it can be seen that within the framework of the realistic design, the minimum rotation rate value is limited by ~0.01 Deg/Hour for the ~85 cm cavity length.

The invention can share the same cavity using two regimes of operation, namely: loss-compensated (pump laser on) and not compensated (pump laser off). The toggling or gradual change between sensor's regimes of operation can be realized, for example, by external optical pump laser 21 switching or by modulation of the coupling ratio of the pump coupler 20, or by external modulation of the pump source using the pump modulator 22. In general, such various regimes require different feedback loop 17 modes of operation.

Figure 9:
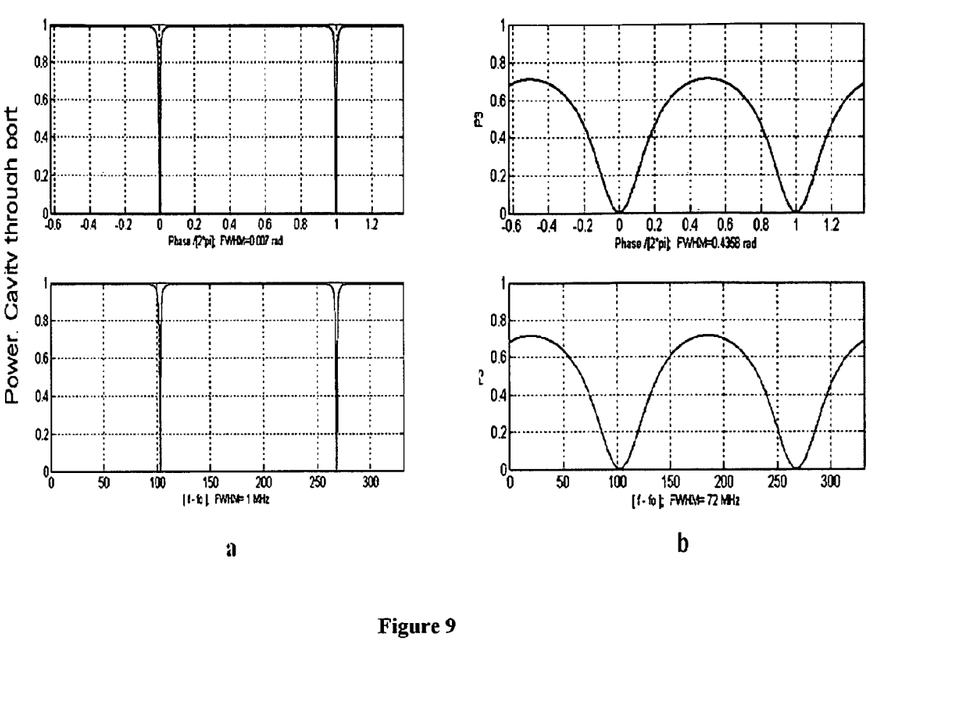

FIG. 9(a),(b) illustrates the resonant response of the cavity with and without loss compensation, for example with pump switched on and off, respectively. The cavity circumference is optimized for the compensated losses (~85 cm in FIG. 7). For the gyroscope application of the sensor, the minimum rotation-rate sensitivity is 0.011 Deg/Hour and 1.35 Deg/Hour for cases (*a*) and (*b*) of FIG. 9 respectively.

The description of the preferred embodiments of the invention has been presented for purposes of illustration and description. It is not intended to be exhaustive or to limit the invention to the precise from disclosed, and obviously many modifications and variations are possible in the light of the above teaching. The described embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An optical device for a physical parameter's registration and measurement comprising:
    an optical cavity being a closed waveguide loop having at least a first nested configuration with at least a first axis of symmetry,
    the cavity having at least a first waveguides crossing section within the cavity, said waveguides crossing section preserving the symmetry of the cavity;
    a clockwise (CW) and a counterclockwise (CCW) optical waves being introduced to the cavity using at least a first coupler;
    the CW and the CCW optical waves being extracted from the cavity using at least a second coupler;
    the first and the second couplers positioned symmetrically relative to the first axis of symmetry thus creating equal optical paths for CW and CCW;
    a detector registering the difference between the extracted CW and CCW waves characteristics; and
    a signal processing unit calculating the physical parameter of interest based on the registered difference.

2. The optical device of claim 1, wherein the first and the second coupler are the same coupler used for introduction and extraction of the CW and the CCW optical waves; and wherein this coupler is positioned on the first axis of symmetry.

3. The optical device of claim 2, wherein the coupler is tunable.

4. The optical device of claim 1, further comprising at least one phase shifter introduced to the cavity; the phase shifter being able to change a in-cavity-phase of the CW wave and a in-cavity-phase of CCW wave; the phase shifter adjusts the resonant frequency of the cavity to match a laser source frequency.

5. The optical device of claim 1, wherein the cavity is fiber-based.

6. The optical device of claim 1, wherein the cavity being integrated into a substrate.

7. The optical device of claim 6, wherein the substrate is made of semiconductor or ferroelectric or glass or polymer material.

8. The optical device of claim 1, further comprising:
    a light source producing an initial optical beam;
    the initial optical beam being modulated by an amplitude modulator and split into the CW and the CCW waves.

9. The optical device of claim 8, further comprising: a phase modulator receiving the split CW and the CCW waves from the amplitude modulator and modulating a phase of the CW and a phase of the CCW waves before entering the cavity.

10. The optical device of claim 9, further comprising:
    an electronic feedback control loop coming from the detector, the feedback loop adjusting the amplitude modulator and the phase modulator.

11. The optical device of claim 1, wherein the closed waveguide loop having a second nested configuration and a second axis of symmetry.

12. The optical device of claim 1, further comprising N waveguide crossing sections within the cavity, wherein N is a positive integer, and the nested configuration containing multiple waveguide loops inside an external waveguide loop.

13. The optical device of claim 1, wherein the physical parameter is a magnetic field or an electrical current or mechanical perturbations.

14. An optical device for a physical parameter measurement based on registration and monitoring of a difference between a clockwise (CW) and a counterclockwise (CCW) propagating optical waves characteristics, comprising:
    a cavity being an active cavity including an optical gain element providing non-zero gain to waves propagating in the cavity;
    the cavity being a closed waveguide loop having at least one nested configuration with at least one axis of symmetry, the cavity having at least one waveguides crossing section within the cavity, said waveguides crossing section positioned to preserve the symmetry of the cavity;
    the optical gain element being capable of compensation of light propagation losses in the CW and CCW waves within the cavity;
    wherein the losses compensation by the optical gain element may be changed gradually or discretely allowing variability of the device specifications;
    the CW and the CCW optical waves being introduced to the cavity and extracted from it using at least one coupler;
    a detector registering the difference between the extracted CW and CCW waves characteristics; and
    a signal processing unit calculating the physical parameter of interest based on the registered difference.

15. The optical device of claim 14, wherein the device operation with low, but not zero, gain is used for a low sensitivity; and the device operation with high gain is used for a high sensitivity sensing.

16. The optical device of claim 14, wherein the device operates discretely switching from a passive (without gain) to an active (with gain) regime providing two different scale factors, dynamic ranges and stability parameters of the device.

17. The optical device of claim 14, wherein the waveguides crossing section is lying on the axis of symmetry.

18. The optical device of claim 14, wherein
    the optical gain element uses erbium doping of the cavity waveguides for the CW and CCW waves amplification.

19. The optical device of claim 18, further comprising:
    a pumping laser feeding the optical gain element;
    the pumping laser outputting a pumping light into a pump transmitting waveguide;
    the pumping transmitting waveguide being coupled to the cavity waveguides by a pump coupler.

20. The optical device of claim 19, wherein the pumping laser can be turned on/off or externally modulated by a pump modulator for changing a regime of the optical device operation.

21. The optical device of claim 19, wherein the losses compensation is performed by changing a coupling rate of the pump coupler.

22. A method of a physical parameter measurement, comprising:
    passing a clockwise (CW) and a counterclockwise (CCW) propagating optical waves through an optical cavity being a closed waveguide loop having at least one nested configuration with at least one axis of symmetry, the cavity having at least one waveguides crossing section within the cavity, said waveguides crossing section positioned to preserve the symmetry of the cavity;

extracting the CW and CCW waves from the cavity from the couplers located symmetrically relative to the axis of symmetry;

detecting a difference between the characteristics of the extracted CW and CCW waves; and calculating the physical parameter of interest based on the detected difference.

23. The method of a physical parameter measurement of claim 22, further comprising:

phase modulating of the extracted CW and CCW waves for eliminating of a backscattering signal from them.

24. The method of a physical parameter measurement of claim 22, further comprising:

amplifying the CW and CCW waves using an optical gain element;

controlling the optical gain element; and changing the measurement scale and sensitivity by changing the CW and CCW waves amplification, wherein the gain is not zero.

* * * * *